(12) United States Patent
Gambina et al.

(10) Patent No.: US 6,393,258 B1
(45) Date of Patent: May 21, 2002

(54) PROCESS AND SYSTEM FOR ADJUSTING THE LEVEL OF THE SPURIOUS LINES OF THE OUTPUT FREQUENCY SPECTRUM OF A SINGLE-SIDEBAND FREQUENCY TRANSPOSITION DEVICE, IN PARTICULAR INCORPORATED INTO A MOBILE TELEPHONE

(75) Inventors: Maria Luisa Gambina, Catiana (IT); Vincent Fournier, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/420,962

(22) Filed: Oct. 20, 1999

(30) Foreign Application Priority Data

Oct. 23, 1998 (FR) ............................................. 98 13332

(51) Int. Cl.$^7$ ........................... H04B 17/00; H04B 1/04; H04L 27/04; H04L 25/03
(52) U.S. Cl. ..................... 455/67.4; 455/67.1; 455/115; 455/118; 455/111; 455/104; 375/295; 375/296
(58) Field of Search .............................. 455/104, 111, 455/115, 118, 6.1, 67.4; 375/295, 296, 214, 216

(56) References Cited

FOREIGN PATENT DOCUMENTS

| EP | 0 477 720 A | 4/1992 | ........... H04L/27/36 |
| EP | 0 503 588 A2 | 9/1995 | ........... H04L/27/36 |

OTHER PUBLICATIONS

G. Yang et al.: "I/Q Modulator Image Rejection Through Modulation Pre–Distortion" 1996 IEEE 46$^{th}$ Vehicular Technology Conference, Mobile Technology for the Human Race, Atlanta, Apr. 28–May 1, 1996, vol. 2, No. CONF. 46, Apr. 28, 1996, pp. 1317–1320, XP000593152, *FIG. 4*.

*Primary Examiner*—Daniel Hunter
*Assistant Examiner*—Meless Zewdu
(74) *Attorney, Agent, or Firm*—Lisa K. Jorgenson; Allen, Dyer, Doppelt, Milbrath & Gilchrist, P.A.

(57) ABSTRACT

A process for adjusting a level of spurious signal spectral lines in an output frequency spectrum provided by a single-sideband frequency mixer includes the step of generating two mutually phase-shifted test signals defined by a plurality of parameters, and applying the two test signals to respective first and second inputs of the single-sideband frequency mixer. The level of each of the spurious signal spectral lines are measured for different test values corresponding to the plurality of parameters of the two test signals. Reference values are determined for the plurality of parameters for minimizing the level of the spurious signal spectral lines. The reference values are determined by a numerical calculation performed on a predetermined number of different test values of the plurality of parameters, and corresponding measured values of the levels with respect to two parabolic relations linking the levels of the two spurious signal spectral lines with the plurality of parameters. This process minimizes a duration of the adjustment by using a reduced number of test values.

28 Claims, 4 Drawing Sheets

PROCESS AND SYSTEM FOR ADJUSTING THE LEVEL OF THE SPURIOUS LINES OF THE OUTPUT FREQUENCY SPECTRUM OF A SINGLE-SIDEBAND FREQUENCY TRANSPOSITION DEVICE, IN PARTICULAR INCORPORATED INTO A MOBILE TELEPHONE

FIELD OF THE INVENTION

The invention relates to the field of electronics, and, more particularly, to a system and method for adjusting a radio-frequency emission spectrum.

BACKGROUND OF THE INVENTION

In a mobile telephone, the useful signal emitted, in this instance voice, is a low-frequency signal transposed into a high-frequency signal using an IQ mixer with the aid of a high-frequency signal originating from a local oscillator. The output spectrum of the signal provided by the mixer therefore contains a so-called useful line. This corresponds to the useful signal transposed to high frequency, and to the spurious lines. The spurious lines in this instance are the line of the local oscillator signal as well as the image line of the useful signal.

When a mobile telephone is locked for a predetermined duration, e.g., 12.5 ms, onto a transmission frequency channel, it is necessary for the spectrum of the signal emitted to occupy the least possible pass band to disturb as little as possible the other transmission frequency channels which may be allotted to other radio-frequency transmitters/receivers. Also, the local oscillator line and the image line can disturb the other channels. The adjusting of the mixer is therefore aimed at canceling, or at the very least at decreasing the levels of the spurious lines, i.e., the level of the image line and of the local oscillator line.

Adjustment includes tailoring the symmetry of the low-frequency input signals of the mixer to compensate for the internal asymmetries of this component which are responsible for increasing the image and local oscillator lines of the output spectrum. In this regard, two parameter test signals are delivered respectively to the input of the two paths I and Q of the mixer. Each test signal typically has a DC component and a periodic component. The periodic component is typically sinusoidal. The periodic components of the two test signals are mutually phase-shifted. The adjustment includes tailoring the value of the DC components for a fixed value of the frequency of the local oscillator signal. The adjustment also includes adjusting the ratio of the amplitudes of the two sine components and the value of the phase shift to minimize the levels of the spurious lines.

A conventional method for carrying out this tailoring includes performing a sweep on the input path I, and then on the path Q, for each possible local oscillator frequency associated with a transmission channel. The various values are measured for the parameters of the test signals, along with the levels obtained for the image and local oscillator lines. This operation is repeated while refining the sweep step size until the desired rejection is obtained. Parameter values are thus obtained making it possible to obtain very low levels for the image and local oscillator lines.

However, this method has the drawback of requiring a very considerable number of measurements, typically on the order of a few tens to a few hundreds for a local oscillator frequency value. Consequently, this provides a very long adjustment time. Moreover, the adjustment is currently performed with a nominal supply voltage. Furthermore, a check is made as to whether, at the end of the life of the battery of the telephone, the quality of the output spectrum of the mixer is still in accordance with the desired specifications.

However, during the operation of a telephone, the variations in the supply voltage and/or in the temperature in particular, may modify certain characteristics of the transistors forming certain elements of the mixer. This may consequently modify its behavior, and in particular, the internal asymmetries. Hence, this results in a misfit between the adjustment parameters established during the test with the nominal voltage. Optimal adjustment of the mixer would then require a new adjustment of the parameters of the test signals to be performed in real time. Such a real-time adjustment, i.e., for a duration in which the telephone is locked onto a transmission channel, is totally incompatible with the duration of adjustment currently required.

Furthermore, the effectiveness of the current method is poor as it becomes closer to the solution. This is because the measurement noise, although very low, tends to trap the iterative search algorithm in a local minimum. This leads to obtaining reference values or optimal values for these parameters which are different from the theoretical reference values.

SUMMARY OF THE INVENTION

An object of the invention is to provide an adjustment for the output spectrum of an IQ mixer that requires a very low number of measurements to determine the parameters of the test signals applied to the IQ mixer.

Another object of the invention is provide an adjustment to the input signals applied to the IQ mixer which can be implemented in real time in a mobile telephone.

A further object of the invention is to increase the effectiveness of the above described adjustment.

The invention results, in particular, from the fact that it has been found that it is possible to correlate the power level of the image and local oscillator lines of the output spectrum with the various parameters of the test signals via two parabolic mathematical relations. On the basis of this, the determination of the reference or optimal values for the relevant parameters, and reference values corresponding to theoretically zero levels of these spurious lines can be performed by a numerical calculation on a reduced number of measurements. This is typically a few measurement points.

The invention is therefore distinguished from the prior art, in particular, by the fact that the determination of these reference values is performed by a numerical calculation, while in the conventional method this determination is performed solely by observing the measured levels of a very large number of points. This is done for selecting the values of the parameters that have led to a minimum level.

The invention thus makes it possible to decrease the duration of the adjustment in a ratio of greater than ten. This decreases the cost of products incorporating such a mixer given that the cost of the test represents a considerable percentage of the cost of these products. Furthermore, the duration of such an adjustment according to the invention makes it possible, if necessary, to implement such an adjustment in real time during the operation of a mobile telephone.

Stated otherwise, the invention therefore provides a process for adjusting the level of the spurious lines of the output frequency spectrum of a single-sideband frequency mixer.

This process comprises the steps of:

delivering at the input of the two paths of the frequency mixer two mutually phase-shifted test signals each having a plurality of parameters;

measuring the level of each of the spurious lines for different test values of the various parameters of the two test signals; and determining reference values for the various parameters making it possible to minimize the levels of the spurious lines.

According to a general characteristic of the invention, the reference values are determined by a numerical calculation performed on a predetermined number of different test values of the parameters and corresponding measured values of the levels. This is done with respect to two parabolic type relations linking the levels of the two spurious lines with the parameters to minimize the duration of adjustment by using a reduced number of test values.

According to one mode of implementation of the process, each test signal comprises a DC component and a periodic component, e.g., a sine component. The DC components of the two test signals form respectively first and second parameters. The ratio of the amplitudes and the relative phase-shift of the two periodic components of the two test signals form respectively third and fourth parameters. The spurious lines comprise an image line and a local oscillator line. The first and second parameters are linked to the level of the local oscillator line by a first parabolic relation, while the third and fourth parameters are linked to the level of the image line by a second parabolic relation. The reference values of the first and second parameters are thus determined by only making measurements of the level of the local oscillator line, while the reference values of the third and fourth parameters are determined by only making measurements of the level of the image line.

In a general manner, several variations are possible for determining these reference values. This is done with regard to the correlation of the paraboloid type relationships linking the levels of the spurious lines with the values of the parameters of the test signals. A first variation of the invention includes calculating the position of the optimum of the relevant parabolic relation by determining the point at which the derivative is zero.

More precisely, according to this variation the reference value of each parameter is determined by using at least four different test values of the parameter to obtain at least four corresponding measured values of the level. On the basis of the test values and the corresponding values of level, the value of the parameter corresponding to a zero derivative of the corresponding parabolic relation is then calculated. This value forms the reference value for the relevant parameter.

In practice, the number of test values used for this variation is equal to four. On the basis of the four test values and the four measured values of level, it is possible to form two triplets of consecutive test values. For example, the first, the second and the third are one triplet, and the second, the third and the fourth are a second triplet. Advantageously, the difference is then calculated between the two measured values of level corresponding to the extreme test values of each triplet. For example, the difference between the levels corresponding to the first and third test values, and the difference between the levels corresponding to the fourth and second test values.

The ratio is then taken between this difference and the difference of the two extreme values of the relevant triplet. In this instance, the difference is between the third and first test values and, the difference is between the fourth and second test values. Thus, for each triplet, a derivative value associated with the median test value of the triplet is obtained. In this instance, a derivative value is associated with the second test value and a derivative value is associated with the third test value. The reference value is next calculated on the basis of the equation for the straight line passing through two derivative values associated with two different median test values. In this instance, the equation for the straight line passes through the two previously calculated derivative values.

Other variations of the invention include taking a number of measurement points and solving a linear system of several equations having several unknowns. This may be performed according to the known Kramer method. More precisely, according to a second variation of the invention, the reference value of each parameter is determined by using only three different test values of the parameter to obtain three corresponding measured values of level. Also obtained is a linear system of three equations having three unknowns on the basis of the corresponding parabolic relation of the three different test values and of the three corresponding measured values of the level. The linear system is then solved.

Another variation of the invention is even more advantageous since it requires an even smaller number of measurement points. This variation makes it possible to determine the respective reference values of the first and second parameters by using only four different pairs of test values for the first and second parameters. This is done to obtain four corresponding measured values of level and to obtain a first linear system of four equations having four unknowns. This is done on the basis of the corresponding parabolic relation of the four test value pairs and of the four corresponding measured values of level. This first linear system is then solved.

In a similar manner, the respective reference values of the third and fourth parameters are determined by using only four different pairs of test values for the third and fourth parameters. This is done to obtain four corresponding measured values of the level and to obtain a second linear system of four equations having four unknowns. This is done on the basis of the corresponding parabolic relation of the four test value pairs and of the four measured values of level. This second linear system is then solved.

The subject of the invention is also related to a system for adjusting the level of the spurious lines of the output frequency spectrum of a single-sideband frequency mixer. The system comprises a delivery circuit for delivering at the input of the two paths of the frequency mixer two mutually phase-shifted test signals each having a plurality of parameters. The system further includes a measuring circuit for measuring the level of each of the spurious lines for different test values of the various parameters of the two test signals, and a determining circuit for determining reference values for the various parameters making it possible to minimize the levels of the spurious lines.

According to a general characteristic of the invention, the determination circuit for determining the reference values includes a processor able to perform a numerical calculation on a predetermined number of different test values of the parameters and corresponding measured values of levels. This is performed with regards to two parabolic relations linking the levels of the two spurious lines with the parameters.

Furthermore, the subject of the invention is also related to a mobile telephone comprising a single-sideband frequency mixer and a spurious signal spectral level adjusting system to allow implementation of the method according to the invention within the mobile telephone. Implementation of the method is performed in a production factory or real time during operation of the mobile telephone.

BRIEF DESCRIPTION OF THE DRAWINGS

Other advantages and characteristics of the invention will become apparent on examining the detailed description of wholly non-limiting modes of implementation and embodiments, and the appended drawings in which.

DETAILED DESCRIPTION OF THE PREFERRED EMBODIMENTS

Figure 1:
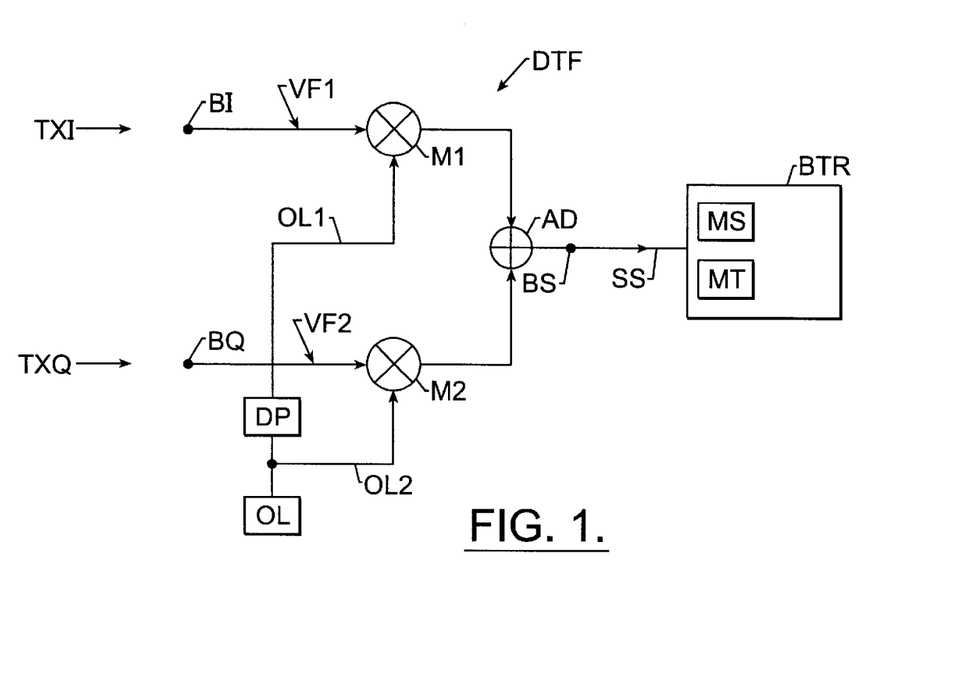
FIG. 1 is a block diagram of an IQ mixer and the associated adjustment circuit according to the present invention.

In FIG. 1, the reference DTF denotes a single-sideband mixer or IQ mixer, comprising two mixing paths VF1 and VF2 combined by an adder AD linked to the output terminal BS of the mixer. The path VF1 comprises a mixer M1 receiving the signal TXI present at the input terminal BI of the mixer and a signal OL1. The signal OL1 is equal to LO cos $\Omega t$ and originates from a local oscillator OL after a 90° phase-shift in a phase-shifter DP. In a similar manner, the path VF2 comprises a mixer M2 receiving the signal TXQ present at the input BQ of the mixer and a signal OL2. The signal OL2 is equal to LO sin $\Omega t$ and originates directly from the local oscillator OL.

To adjust the output spectrum of such a mixer DTF, two parametrizable test signals TXI and TXQ, given respectively by formulas (1) and (2) below are injected into the two inputs BI and BQ of the mixer:

$$TXI = DCI + \sin \omega t \quad (1)$$

$$TXQ = DCQ + (r)\cos(\omega t + \emptyset) \quad (2)$$

In formula (1), DCI represents the DC component of the signal TXI, and sin $\omega t$ is the sine component of $\omega$. In formula (2), DCQ represents the DC component of the signal TXQ, while r cos($\omega t + \emptyset$) represents the cosine component of this signal TXQ. The variable r represents the amplitude of this cosine component. Since the amplitude of the sine component of the signal TXI has been deliberately made equal to 1, r represents the ratio of the amplitudes of the two periodic components of the two test signals. Likewise, Ø represents the relative phase-shift of the two periodic components of the two signals TXI and TXQ.

Figure 2:
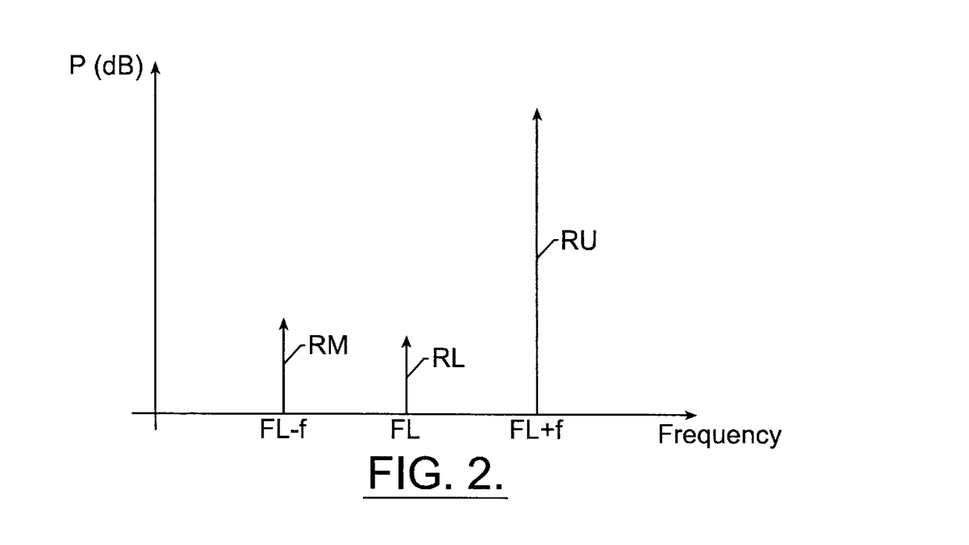
FIG. 2 is a plot illustrating the output spectrum of an IQ mixer according to the present invention.

If the mixer Q was perfect, the output signal SS would comprise just a single line termed the useful line RU centered on the frequency FL+f, where FL is the frequency of the local oscillator corresponding to $\Omega$, and where f is the frequency of the input signal. In this instance f corresponds to $\omega$. However, in practice, a mixer exhibits imperfections, especially with regards to the construction of the phase-shifters and/or of the transistors forming the mixer. As a result, the output spectrum of the signal SS comprises, apart from the useful line RU, two spurious lines as shown in FIG. 2. These lines are the local oscillator line RL centered on the frequency FL and an image line RM centered on the frequency FL−f.

Adjustment of the output spectrum of the mixer DTF includes making the various parameters of the two test signals vary in such a way as to minimize the level or power P of the spurious lines RM and RL. The prior art method of adjustment varied the parameters of the signal TXI according to a given sweep step size, while keeping the parameters of the signal TXQ constant. This sweep is then repeated on the Q path while keeping the parameters of the signal TXI constant. These two iterative sweeps were then repeated with smaller sweep step sizes until the values of the parameters that led to the obtaining of a minimum level of the line RM and the line RL were selected.

The invention proposes a significantly different process from the prior art by requiring only a few measurement points. In this regard, the power P of the local oscillator line can be correlated with the parameters DCI and DCQ via a first parabolic relation defined by formula (3) below:

$$P(RL) = K1(DCI - DCI0)^2 + K1(DCQ - DCQ0)^2 \quad (3)$$

Likewise, the power of the image line can be correlated with the other two parameters, r and Ø, via a second parabolic relation defined by formula (4) below:

$$P(IM) = (K2r - r0)^2 + K2r(\emptyset - \emptyset 0)^2 \quad (4)$$

In these formulas, DCI, DCQ, r and Ø represent the current test values of the various parameters while DCI0, DCQ0, r0 and Ø0 represent the reference values of these parameters. The power of the line RL and the power of the line IM are zero, and K1 and K2 are constants. The purpose of the adjustment is therefore to determine these reference values by calculation. This determination is performed in a processing block BTR as shown in FIG. 1, which includes a conventional spectral analysis circuit MS and a processor MT. The processor MT is a microprocessor, for example.

Figure 3:
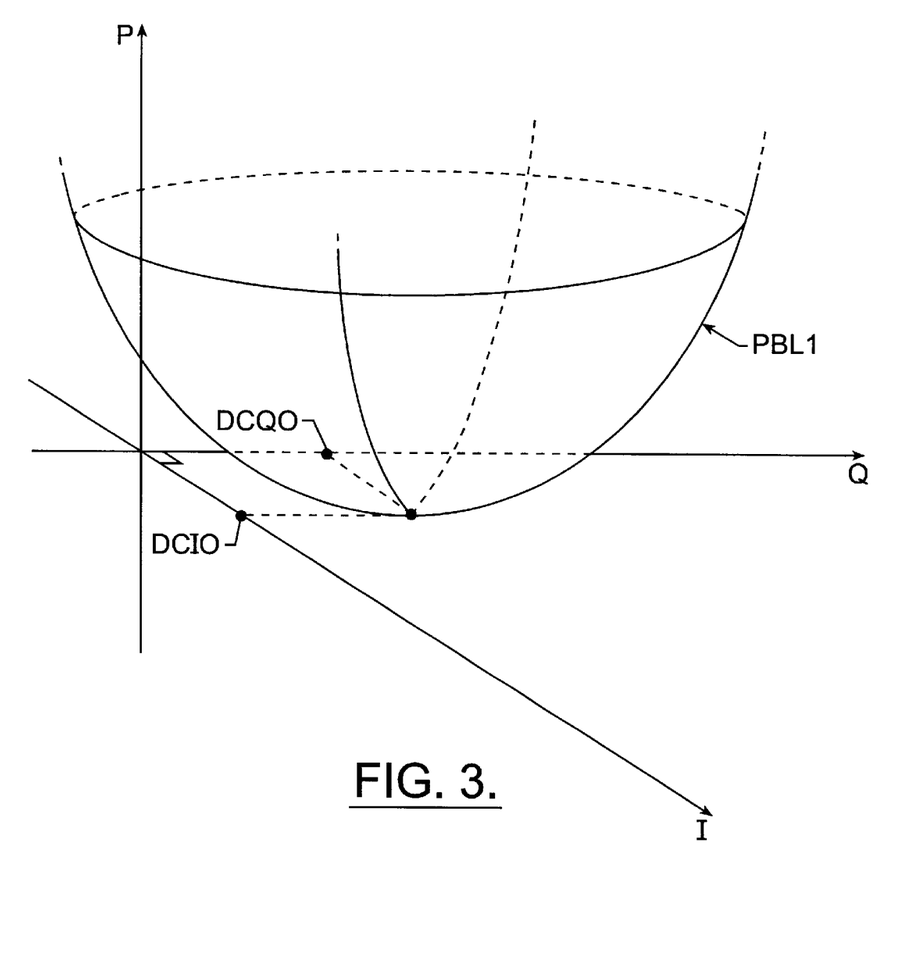
FIG. 3 is a plot illustrating a correlation between the level of the spurious lines and certain adjustment parameters according to the present invention.
Figure 4:
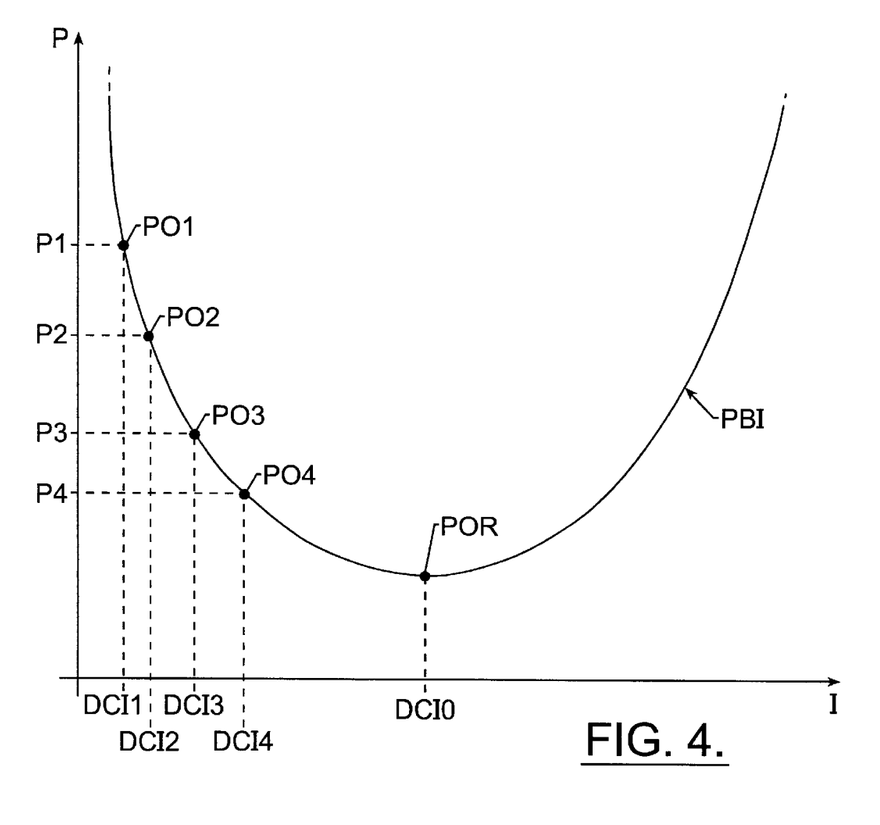
FIG. 4 is a plot illustrating a section through the Q plane of the paraboloid illustrated in FIG. 3.
Figure 5:
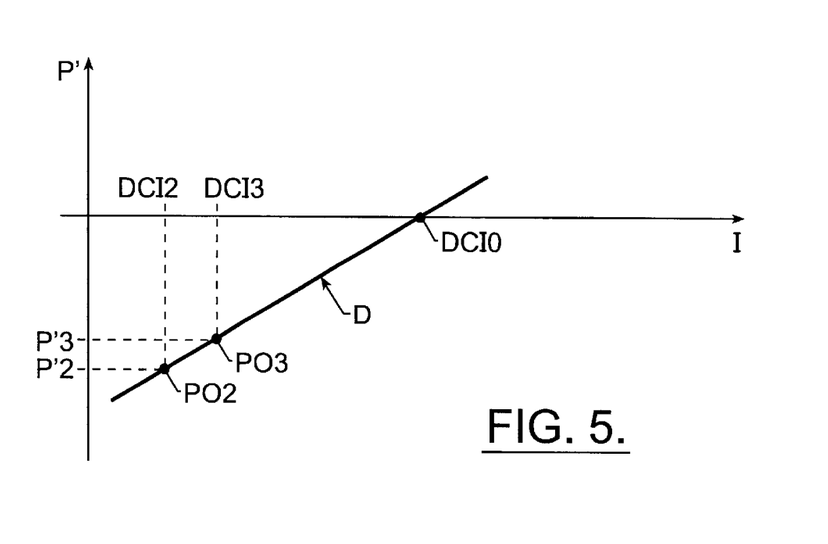
FIG. 5 is a plot partially illustrating a first variation of the process according to the present invention.

Certain modes of implementation of the process making it possible to determine the reference values DCI0 and DCQ0 of the parameters DCI and DCQ, which will now be described in greater detail while referring more particularly to FIGS. 3, 4 and 5. In FIG. 3, PBL1 denotes the paraboloid of correlation between the power of the line RL and the various values of the parameters DCI and DCQ. For a fixed value DCQf, the section of the paraboloid PBL1 in the plane DCQf is a parabola PBI as illustrated in FIG. 4.

A first variation of the invention for determining the reference value DCI0 and the reference value DCQ0 is based upon the fact that the derivative of a parabola is a straight line and will include finding the point POR at which this derivative is zero. More precisely, predetermined values DCQf, rf and Øf are fixed for the other parameters DCQ, r and Ø.

Four different test values are also chosen for the parameter DCI. Namely the test values DCI1, DCI2, DCI3 and DCI4 and the corresponding test signals TXI and TXQ are applied in succession. The measurement circuit MS of the processing block BTR determines for each of the points PO1, PO2, PO3 and PO4 of the parabola PB1 the corresponding levels P1, P2, P3 and P4 of the local oscillator line RL. On the basis of this, for the measurement point triplet PO1, PO2 and PO3, the value of the derivative P'2 at the point PO2 is determined via formula (5) below:

$$P'2 = \frac{P3 - P1}{(DCI3 - DCI1)} \qquad (5)$$

Likewise, for the triplet PO2, PO3 and PO4, the value P'3 of the derivative at the point PO3 is determined via formula (6) below:

$$P'3 = \frac{P4 - P2}{(DCI4 - DCI2)} \qquad (6)$$

The two measurement points PO2 and PO3 having respective coordinates (P'2, DCI2) and (P'3, DCI3), make it possible to determine the two parameters α and β of the straight line D (FIG. 5) with equation:

$$P' = \alpha DCI - \beta \qquad (7)$$

The reference value DCI0, which is equal to β/α, can therefore be determined from this. The reference value DCI0 has therefore been obtained through a simple numerical calculation carried out via software within the processor MT of the processing block BTR. The processing has required only four separate measurements of the level of the line RL corresponding to four difference test values DCI1–DCI4 for the parameter DCI.

It would have been possible to use a larger number of measurement points to determine, in particular, with greater accuracy the parameters β and α of the straight line D. Once the reference value DCI0 has been obtained, the same operations are repeated for the calculation of the reference value DCQ0 of the parameter DCQ. Stated otherwise, a constant value is chosen for the parameter DCI, for example, just the value DCI0 is calculated. Four different test values DCQ1–DCQ4 are chosen for the parameter DCQ, and the reference value DCQ0 is calculated in a manner similar to that just described for the reference value DCI0.

An additional iteration could be performed to verify, in particular, the value DCI0. This is done by fixing on this occasion for the parameter DCQ, the reference value DCQ0 just calculated, and by recalculating the reference value DCI0 in a manner similar to that just described. This variation of the invention has required, for a given local oscillator frequency FL, eight measurements of the level of the line RL to determine the reference values DCI0 and DCQ0 of the parameters DCI and DCQ. Four measurements correspond to the four different test values DCI1–DCI4, and four measurements correspond to the four different test values DCQ1–DCQ4.

What has just been described applies also to calculation of the reference values r0 and Ø0 of the other two parameters r and Ø. This is done by measuring the level of the image line IM, and by using the properties of the relation of the paraboloid type correlating this level of the image line with the values of the parameters r and Ø. Another variation will now be described, which makes it possible to use just three different test values for the calculation of each parameter.

More precisely, referring again to formula (3) giving the correlation of the power of the local oscillator line with respect to the parameters DCI and DCQ, this formula (3) can, once expanded, be written into the form of formula (8) below:

$$P(RL) = (a)DCI^2 + (b)DCI + c \qquad (8)$$

In this formula (8), the variables a, b and c are linked with the constants K1, DCI0 and DCQ.

Under these conditions, the calculation of the reference value DCI0 is performed as follows. A value DCQf is fixed for the parameter DCQ, and this time three different test values DCI1–DCI3 are chosen for the parameter DCI. For example, the test values correspond to the points PO1, PO2 and PO3 of FIG. 4. The levels P1, P2 and P3 of the local oscillator line are then measured. This then provides the linear system (9) of three equations having three unknowns, and in which the three unknowns are respectively the variables a, b and c.

$$P1 = (a)DCI1^2 + (b)DCI1 + c$$
$$P2 = (a)DCI2^2 + (b)DCI2 + c$$
$$P3 = (a)DCI3^2 + (b)DCI3 + c \qquad (9)$$

This system can readily be solved and the value DCI0 is then equal to the ratio −b/2a. The same operations can be performed for the calculation of the reference values DCQ0, r0 and Ø. This variation of the invention requires only three different test values for the calculation of each parameter for a given value of the frequency FL.

Another variation of the invention, even more advantageous, makes it possible to calculate pairs of parameters using just four different values of pairs for these parameters. More precisely, relation (3) can be written into the form of relation (10).

$$P(RL) = (a)(DCI^2 + DCQ^2) + (b)DCI + (c)DCQ + d \qquad (10)$$

with, a=K1
  b=−2 K1*DCI0
  c=−2 K1*DCQ0
  d=DCI0² + DCQ²

In this case, four different pairs (DCI1, DCQ1), (DCI2, DCQ2), (DCI3, DCQ3) and (DCI4, DCQ4) are respectively chosen, and the level of the line RL is measured for each of these pairs. From this, a system of four equations having four unknowns is determined in which the unknowns are the variables a, b, c and d. Once this system has been solved by the processor, the value DCI0 is obtained by calculating the ratio −b/2a, and the value DCQ0 by calculating the ratio −c/2a.

A similar calculation can be performed to determine the reference values r0 and Ø0 of the pair of parameters r and Ø. This time by using the level of the image line IM and the paraboloid relation given by formula (4) above. This variation, which may be referred to as global, therefore makes it possible to obtain the four reference values of the four sought-after parameters by using only eight measurements of the level, i.e., eight acquisitions, for each fixed value of FL. Four measurements of the level of the line RL and four measurements of the level of the line IM are performed.

Another variation, which may be referred to as compact, makes it possible to obtain the four reference values of the four sought-after parameters by using just four acquisitions for each fixed value of FL. This is because by using relation (10) and the counterpart relation for the image line, four different quadruplets DCIi, DCQi, ri and Øi, where i=1 to 4 are chosen. The level of the image line and the level of the local oscillator line are measured for each of these quadruplets. From this, two independent systems of four equations having four unknowns are determined. These equations are solved in a manner similar to what was described with respect of the global variation to obtain the reference values of the parameters.

The reference values, the obtaining of which has just been described, have been calculated for a given value of the local oscillator frequency. This calculation can be performed for all the local oscillator frequencies corresponding to the various frequencies of the transmission channels subdividing the radio-frequency transmission band of a mobile telephone. For example, there are sixty channels within the 850 MHZ–950 MHZ frequency band.

In practice, in a mobile telephone TMC equipped with an antenna AT for example, the mixer DTF is preceded by an auxiliary circuit CX (FIG. 6) formed of two paths VX1 and VX2 respectively linking the two input terminals BI and BQ of the mixer to a terminal BX. The terminal BX receives the useful signal, in this instance voice. The path VX1 comprises an amplifier AM1 followed by an adder AD1 also receiving an auxiliary voltage delivered by a first auxiliary voltage source ST1. The path VX2 comprises a delay circuit MR, for example, a delay line. This is followed by a variable-gain amplifier AM2 followed by an adder AD2. The adder AD2 also independently receives an auxiliary voltage originating from a second auxiliary voltage source ST2.

Figure 6:
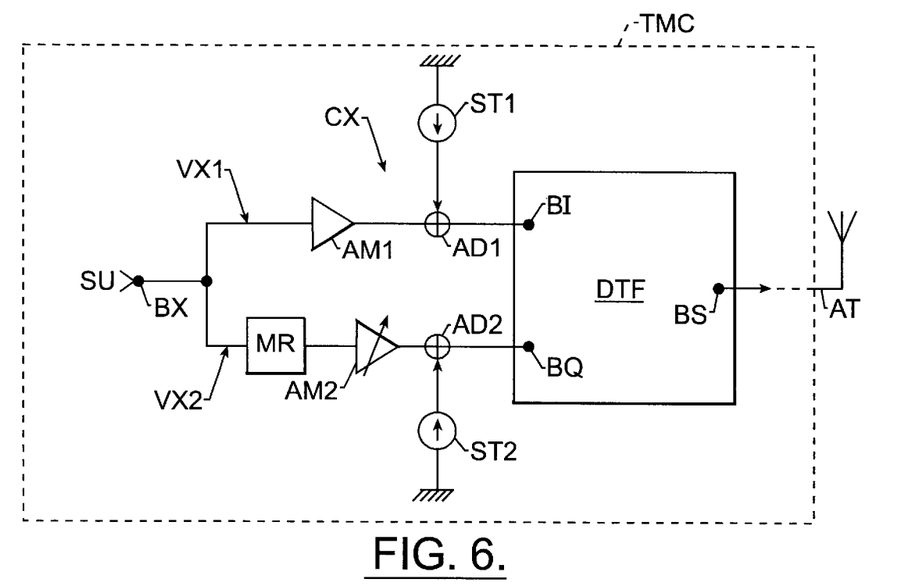
FIG. 6 is a block diagram of one embodiment of an adjustment system according to the present invention.

The value of the auxiliary voltage ST1 corresponds to the parameter DCI, while the value of the auxiliary voltage ST2 corresponds to the parameter DCQ. The variable gain of the amplifier AM2 corresponds to the parameter r, and the delay induced by the delay circuit MR corresponds to the phase shift Ø. Thus, for a given frequency of the local oscillator, the value of the delay, the value of the gain of the amplifier AM2, and the values of the auxiliary voltages ST1 and ST2 can be adjusted so that these values correspond to the reference values Ø0, r0, DCI0 and DCQ0 obtained when adjusting the mixer.

Although this adjustment can be performed in the factory and stored in a memory in the mobile telephone, the adjusting process according to the invention makes it advantageously possible to carry out such an adjustment in real time during the operation of the mobile telephone TMC. In this regard, the adjustment system illustrated in FIG. 7 can be provided. The processing block BTR comprises a spectral analyzer and a processor, which are generally present in any mobile telephone, and continuously receives the output signal from the mixer DTF.

Figure 7:
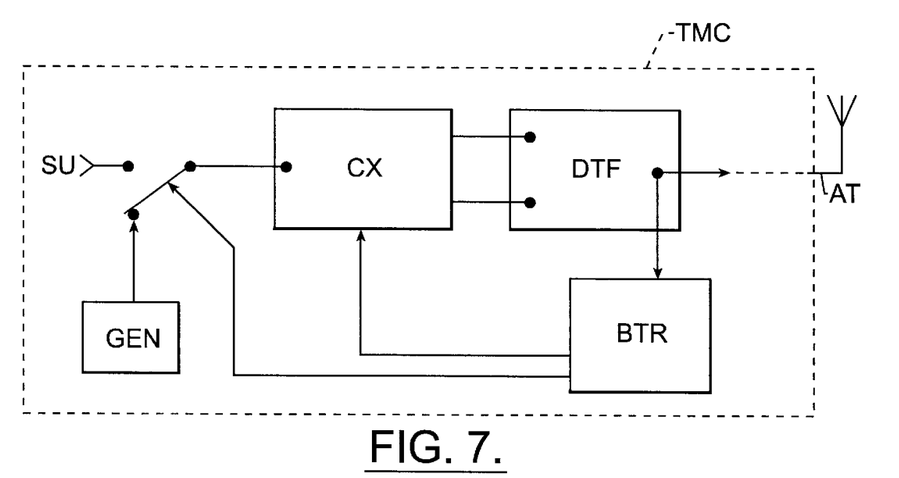
FIG. 7 is a block diagram of another embodiment of an adjustment system that is particularly compatible for incorporation within a mobile telephone according to the present invention.

Furthermore, the person skilled in the art is aware that the mobile telephone is locked for predefined elementary durations, e.g., 12.5 ms, onto a selected frequency channel. The invention therefore provides, for example, at the start of the elementary lock-on duration a periodic auxiliary signal. This is for the input of the auxiliary circuit CX to be switched onto a generator GEN generating the periodic auxiliary signal.

The periodic auxiliary signal is, for example, a sinusoidal signal. The processor included within the processing block BTR then varies the values of the auxiliary voltage sources. The gain of the amplifier AM2 and the value of the delay of the delay circuit MR are determined. Also determined through a numerical calculation similar to that just described is the various reference values with regard to the current frequency of the local oscillator and the actual conditions of operation of the telephone. Once these parameters have been set, the processor switches the input of the auxiliary circuit CX onto the speech-receiving input SU.

That which is claimed is:

1. A process for adjusting a level of spurious signal spectral lines in an output frequency spectrum provided by a single-sideband frequency mixer, the process comprising the steps of:

generating two mutually phase-shifted test signals defined by a plurality of parameters, and applying the two test signals to respective first and second inputs of the single-sideband frequency mixer;

measuring the level of each of the spurious signal spectral lines for different test values for the plurality of parameters of the two test signals; and determining reference values for the plurality of parameters for minimizing the level of the spurious signal spectral lines by a numerical calculation performed on a predetermined number of different test values and corresponding measured values of the levels with respect to two parabolic relations linking the levels of the spurious signal spectral lines with the plurality of parameters for reducing adjustment time by using a reduced number of test values.

2. A process according to claim 1, wherein each of the two test signals comprises a DC component and a periodic component, the DC component of the two test signals defined by respective first and second parameters, and a ratio of amplitudes and a relative phase-shift of the two periodic components defined by respective third and fourth parameters.

3. A process according to claim 2, wherein the spurious signal spectral lines comprises an image signal spectral line and a local oscillator signal spectral line, and the first and second parameters are linked to a level of the local oscillator signal spectral line by a first parabolic relation, and the third and fourth parameters are linked to a level of the image signal spectral line by a second parabolic relation; and wherein the process further comprises the steps of:

measuring the level of the local oscillator signal spectral line for determining reference values of the first and second parameters; and measuring the level of the image signal spectral line for determining reference values of the third and fourth parameters.

4. A process according to claim 2, wherein the reference value of each parameter is determined by using at least four different test values of each parameter to obtain at least four corresponding measured values of the level; and wherein the process further comprises the step of calculating a value of each parameter corresponding to a derivative equal to zero of the corresponding parabolic relation with respect to the test values and the corresponding values of the level, the value of each parameter corresponds to a derivative equal to zero of the corresponding parabolic relation forming the reference value for the relevant parameter.

5. A process according to claim 4, wherein the reference value of each parameter comprises at least two triplets of consecutive test values; and wherein the step of calculating further comprises the steps of:

calculating a difference between two measured values of the level corresponding to an extreme test value of each triplet, and a ratio between this difference and a difference of the two extreme values of the relevant triplet to obtain for each triplet a derivative value associated with a median test value of the triplet; and calculating a reference value corresponding to an equation for a straight line passing through two derivative values associated with two different median test values.

6. A process according to claim 2, wherein the reference value for each parameter is determined by using only three different test values of each parameter to obtain three corresponding measured values of the level; the process further comprising the steps of:

obtaining a linear system of three equations having three unknowns corresponding to a parabolic relation of the three different test values and of the three corresponding measured values of the level; and solving the linear system of three equations.

7. A process according to claim 2, further comprising the steps of:

determining the respective reference values of the first and second parameters by using only four different pairs of test values for the first and second parameters to obtain four corresponding measured values of the level;

obtaining a first linear system of four equations having four unknowns corresponding to a parabolic relation of the four test value pairs and of the four corresponding measured values of level;

solving the first linear system of four equations;

determining the respective reference values of the third and fourth parameters by using only four different pairs of test values for the third and fourth parameters to obtain four corresponding measured values of level;

obtaining a second linear system of four equations having four unknowns corresponding to a parabolic relation of the four test value pairs and of the four measured values of level; and solving the second linear system of four equations.

8. A process according to claim 1, wherein the process is performed in a mobile telephone locked onto a transmission channel for a predetermined duration; and the process further comprising the step of determining the reference values during the predetermined duration.

9. A process for adjusting a level of spurious signal spectral lines in an output frequency spectrum within a predetermined duration, the process comprising the steps of:

generating two mutually phase-shifted test signals defined by a plurality of parameters, and applying the two test signals to respective first and second inputs of a single-sideband frequency mixer;

measuring the level of each of the spurious signal spectral lines for different test values for the plurality of parameters of the two test signals; and determining reference values for the plurality of parameters for minimizing the level of the spurious signal spectral lines, during the predetermined duration, by a numerical calculation performed on a predetermined number of different test values and corresponding measured values of the levels with respect to two parabolic relations linking the levels of the spurious signal spectral lines with the plurality of parameters for reducing adjustment time by using a reduced number of test values.

10. A process according to claim 9, wherein each of the two test signals comprises a DC component and a periodic component, the DC component of the two test signals defined by respective first and second parameters, and a ratio of amplitudes and a relative phase-shift of the two periodic components defined by respective third and fourth parameters.

11. A process according to claim 1, wherein the spurious signal spectral lines comprises an image signal spectral line and a local oscillator signal spectral line, and the first and second parameters are linked to a level of the local oscillator signal spectral line by a first parabolic relation, and the third and fourth parameters are linked to a level of the image signal spectral line by a second parabolic relation; and wherein the process further comprises the steps of:

measuring the level of the local oscillator signal spectral line for determining reference values of the first and second parameters; and measuring the level of the image signal spectral line for determining reference values of the third and fourth parameters.

12. A process according to claim 10, wherein the reference value of each parameter is determined by using at least four different test values of each parameter to obtain at least four corresponding measured values of the level; and wherein the process further comprises the step of calculating a value of each parameter corresponding to a derivative equal to zero of the corresponding parabolic relation with respect to the test values and the corresponding values of the level, the value of each parameter corresponds to a derivative equal to zero of the corresponding parabolic relation forming the reference value for the relevant parameter.

13. A process according to claim 12, wherein the reference value of each parameter comprises at least two triplets of consecutive test values; and wherein the step of calculating further comprises the steps of:

calculating a difference between two measured values of the level corresponding to an extreme test value of each triplet, and a ratio between this difference and a difference of the two extreme values of the relevant triplet to obtain for each triplet a derivative value associated with a median test value of the triplet; and calculating a reference value corresponding to an equation for a straight line passing through two derivative values associated with two different median test values.

14. A process according to claim 10, wherein the reference value for each parameter is determined by using only three different test values of each parameter to obtain three corresponding measured values of the level; the process further comprising the steps of:

obtaining a linear system of three equations having three unknowns corresponding to a parabolic relation of the three different test values and of the three corresponding measured values of the level; and solving the linear system of three equations.

15. A process according to claim 10, further comprising the steps of:

determining the respective reference values of the first and second parameters by using only four different pairs of test values for the first and second parameters to obtain four corresponding measured values of the level;

obtaining a first linear system of four equations having four unknowns corresponding to a parabolic relation of the four test value pairs and of the four corresponding measured values of level;

solving the first linear system of four equations;

determining the respective reference values of the third and fourth parameters by using only four different pairs of test values for the third and fourth parameters to obtain four corresponding measured values of level;

obtaining a second linear system of four equations having four unknowns corresponding to a parabolic relation of the four test value pairs and of the four measured values of level; and solving the second linear system of four equations.

16. A system for adjusting a level of spurious signal spectral lines in an output frequency spectrum, the system comprising:

an auxiliary circuit providing two mutually phase-shifted test signals defined by a plurality of parameters;

a single-sideband frequency mixer having first and second inputs each receiving one of the two test signals, and an output providing the output frequency spectrum having the spurious signal spectral lines;

a measurement circuit measuring the level of each of the spurious signal spectral lines for different test values of the plurality of parameters of the two test signals; and a processor for determining reference values for the plurality of parameters to minimize the level of the spurious signal spectral lines, said processor performing a numerical calculation on a predetermined number of different test values and corresponding measured values of levels corresponding to two parabolic relations linking the levels of the spurious signal spectral lines with the plurality of parameters to reduce adjustment time by using a reduced number of test values.

17. A system according to claim 16, wherein each test signal comprises a DC component and a periodic component, the DC components of the two test signals defined by respective first and second parameters, and a ratio of amplitudes and a relative phase-shift of the two periodic components of the two test signals defined by respective third and fourth parameters.

18. A system according to claim 17, wherein the spurious signal spectral lines comprises an image signal spectral line and a local oscillator signal spectral line, the first and second parameters are linked to a level of the local oscillator signal spectral line by a first parabolic relation, and the third and fourth parameters are linked to a level of the image signal spectral line by a second parabolic relation.

19. A system according to claim 18, wherein said processor determines the reference values of the first and second parameters with respect to measurements of the level of the local oscillator signal spectral line, and determines the reference values of the third and fourth parameters with respect to measurements of the level of the image signal spectral line.

20. A system according to claim 16, wherein said auxiliary circuit comprises:

a generator generating a periodic auxiliary signal;

first and second variable auxiliary voltage sources;

a first path linking a first input terminal to the first input of said single-sideband frequency mixer, the first path comprising a first amplifier connected to said generator, and a first adder connected to an output of said first amplifier and to an output of said first variable auxiliary voltage source; and a second path linking a second input terminal to the second input of said single-sideband frequency mixer, the second path comprising a variable delay, a second amplifier with variable gain connected to said variable delay, and a second adder connected to an output of said variable delay and to said second variable auxiliary voltage source.

21. A system according to claim 20, wherein said processor selectively varies values of said variable delay, said second amplifier with the variable gain, and said first and second auxiliary voltages sources to generate the two test signals.

22. A system according to claim 16 is included in a mobile telephone.

23. A mobile telephone comprising:

a transmitter comprising a single-sideband frequency mixer having an output providing an output frequency spectrum including spurious signal spectral lines;

a system connected to said single-sideband frequency mixer for adjusting a level of the spurious signal spectral lines in the output frequency spectrum, said system comprising an auxiliary circuit relaying two externally generated mutually phase-shifted test signals defined by a plurality of parameters to first and second inputs of said single-sideband frequency mixer, a measurement circuit measuring the level of each of the spurious signal spectral lines for different test values of the plurality of parameters of the two test signals, and a processor for determining reference values for the plurality of parameters to minimize the level of the spurious signal spectral lines, said processor performing a numerical calculation on a predetermined number of different test values and corresponding measured values of levels corresponding to two parabolic relations linking the levels of the spurious signal spectral lines with the plurality of parameters to reduce adjustment time by using a reduced number of test values.

24. A system according to claim 23, wherein each test signal comprises a DC component and a periodic component, the DC components of the two test signals defined by respective first and second parameters, and a ratio of amplitudes and a relative phase-shift of the two periodic components of the two test signals defined by respective third and fourth parameters.

25. A system according to claim 24, wherein the spurious signal spectral lines comprises an image signal spectral line and a local oscillator signal spectral line, the first and second parameters are linked to a level of the local oscillator signal spectral line by a first parabolic relation, and the third and fourth parameters are linked to a level of the image signal spectral line by a second parabolic relation.

26. A system according to claim 25, wherein said processor determines the reference values of the first and second parameters with respect to measurements of the level of the local oscillator signal spectral line, and determines the reference values of the third and fourth parameters with respect to measurements of the level of the image signal spectral line.

27. A system according to claim 23, wherein said auxiliary circuit comprises:

first and second variable auxiliary voltage inputs;

a first path linking a first input terminal to the first input of said single-sideband frequency mixer, the first path comprising a first amplifier connected to an input receiving periodic auxiliary signal, and a first adder connected to an output of said first amplifier and to the first variable auxiliary voltage input; and a second path linking a second input terminal to the second input of said single-sideband frequency mixer, the second path comprising a variable delay, a second amplifier with variable gain connected to said variable delay, and a second adder connected to an output of said variable delay and to the second variable auxiliary voltage input.

28. A system according to claim 27, wherein said processor selectively varies values of said variable delay, said second amplifier with the variable gain, and respective voltage sources connected to the first and second auxiliary voltages sources to generate the two test signals.

* * * * *

UNITED STATES PATENT AND TRADEMARK OFFICE
CERTIFICATE OF CORRECTION

PATENT NO.   : 6,393,258 B1                                                                 Page 1 of 1
DATED        : May 21, 2002
INVENTOR(S)  : Maria Luisa Gambina and Vincent Fournier It is certified that error appears in the above-identified patent and that said Letters Patent is hereby corrected as shown below:

Title page, Item [54] and Column 1, line 1,
Title, delete "PROCESS AND SYSTEM FOR ADJUSTING THE LEVEL OF THE SPURIOUS LINES OF THE OUTPUT FREQUENCY SPECTRUM OF A SINGLE-SIDEBAND FREQUENCY TRANSPOSITION DEVICE, IN PARTICULAR INCORPORATED INTO A MOBILE TELEPHONE"
Insert -- A SYSTEM FOR ADJUSTING SPURIOUS SINGLE-SIDEBAND SIGNALS FROM A MIXER --

Item [75], Inventors, delete "Catiana" insert -- Catania --

Column 8,
Line 23, delete "Ø." insert -- Ø0 --
Line 63, delete "DCI1" insert -- DCIi --

Column 11,
Line 16, delete "of level" insert -- of the level --
Line 25, delete "of level" insert -- of the level --

Column 12,
Line 52, delete "of level" insert -- of the level --
Line 61, delete "of level" insert -- of the level --

Signed and Sealed this

Fourteenth Day of January, 2003

JAMES E. ROGAN
*Director of the United States Patent and Trademark Office*